Figure 1:
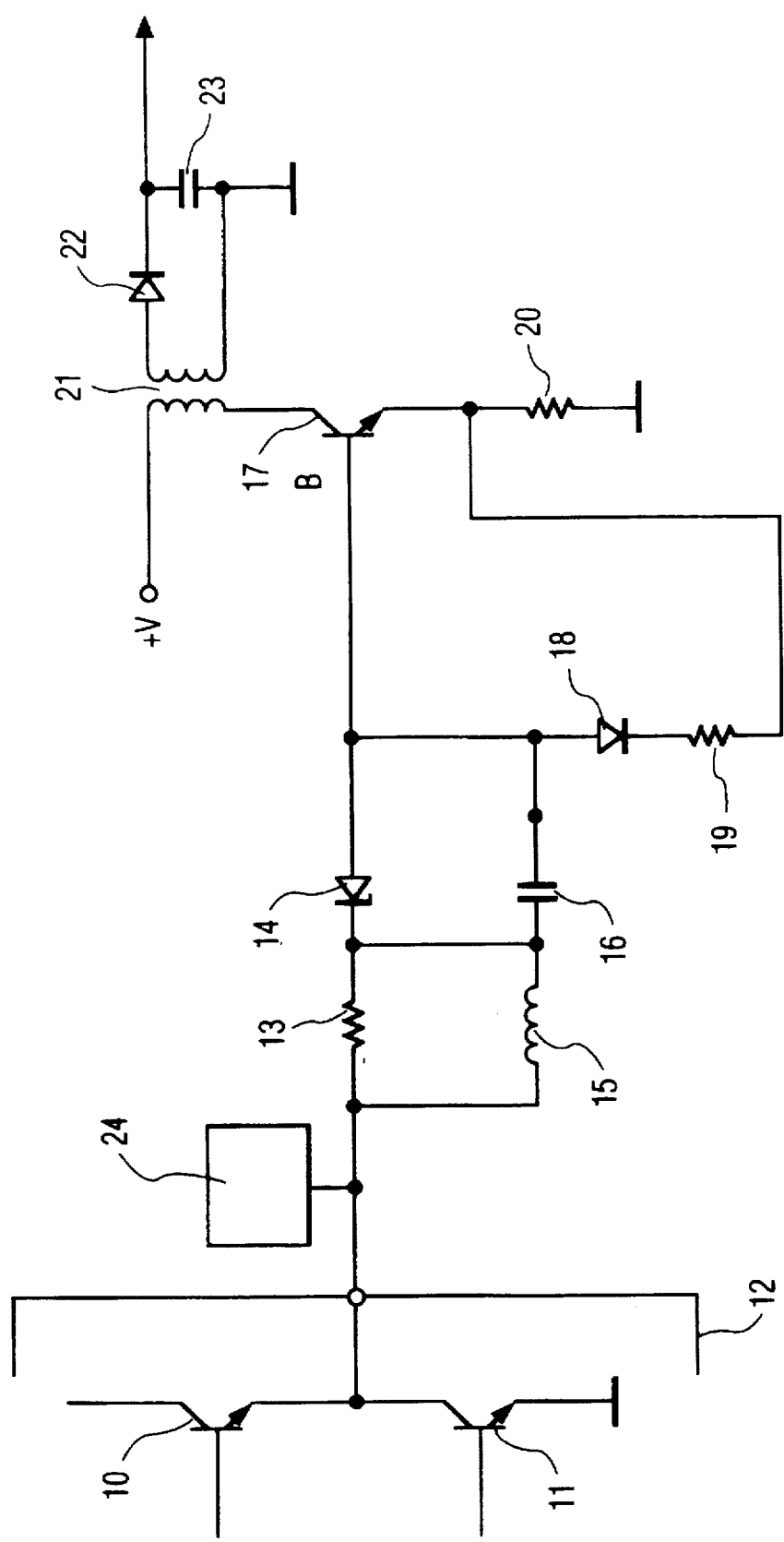

United States Patent [19]

Wu

[11] Patent Number: 5,712,775
[45] Date of Patent: Jan. 27, 1998

[54] STARTUP PROTECTING FOR A SWITCH MODE POWER SUPPLY

[75] Inventor: Chun Hsing Wu, Singapore, Singapore

[73] Assignee: Thomson multimedia S.A., Courbevoie, France

[21] Appl. No.: 622,983

[22] Filed: Mar. 27, 1996

[51] Int. Cl.$^6$ .................................................. H02M 3/335
[52] U.S. Cl. ........................................................... 363/49
[58] Field of Search .............................. 363/49, 50, 52, 363/41, 85, 155; 323/20–21

[56] References Cited

FOREIGN PATENT DOCUMENTS 2283135  1/1995  United Kingdom .

*Primary Examiner*—Aditya Krishnan
*Attorney, Agent, or Firm*—Joseph S. Tripoli; Frederick A. Wein; Shabtay S. Henig

[57] ABSTRACT

Due to low output voltage during flyback mode of start phase the secondary current cannot be fully discharged in time. The current buildup will eventually damage the output transistor if the current is not limited.

In order to prevent the current build up during start phase, the storage time of the output transistor of the SMPS has to be reduced.

During the startup phase a negative bias capacitor is not fully charged. Thereby the base of an output transistor is not biased sufficiently when the transistor is switched off. So the transistor could not operate safely if the collector voltage is higher than Vceo.

It is the object to keep charges, which are stored on the capacitor during startup phase and to reduce discharging of the capacitor.

According to this invention means are provided between the base and the emitter of the output transistor. It is preferred that said means are realised by a resistor and a diode, connected in series.

3 Claims, 1 Drawing Sheet

STARTUP PROTECTING FOR A SWITCH MODE POWER SUPPLY

The present invention relates to a circuit for protection of a switch mode power supply (SMPS) according to the generic part of claim 1.

It is generally known to use a SMPS to supply an electrical or electronical device with a given voltage. Such a power supply includes a switch, which is generally realised by a transistor and which is connected to the primary windings of a transformator, secondary windings of which deliver to desired voltage for the electrical device.

It has found that in the startup phase of the SMPS, which can be e.g. shortly after switching on the mains switch of the electrical device, the output voltage of the SMPS is low, so that the current provided at the secondary windings can not be fully discharged in time. Therby the residual current of the secondary windings affects the primary windings such that the current in the primary windings will increase. This increase will eventually damage the switching transistor if the current is not limited.

So, it is the object of the present invention to present a circuit which allows to protect the switching transistor of a switch mode power supply (SMPS) against induced currents of the primary windings of a transformator.

This object is solved by a circuit according to claim 1. Advantageous embodiments are given by the subclaims.

The basic idea of the present invention is that the switching transistor of a SMPS can be protected against induced current by reducing the storage time of said transistor. When the storage time of the transistor is reduced the current build up phenomena can be reduced.

According to this invention means are provided between the emitter and the base of the switching transistor, whereby the storage time of said transistor is reduced.

In a preferred solution said means are realised as a resistor and a diode. Such an embodiment has the advantage that it is easy to realise.

Using a Schottky diode has the advantage that such a diode is a low forward voltage diode. Thereby turn on of said transistor can be prevented during charging phase.

Further details and advantages will now be explained by the description of embodiments with the aid of the drawings.

FIG. 1 shows a first embodiment of the invention.

FIG. 1 shows a preferred embodiment of the invention. Preferred values and types of the used means are written in brackets. But it must be mentioned that the invention is not restricted to these types of means.

A first control transistors 10 is connected with its emitter to the base of a second control transistor 11. These transistors can be part of an integrated circuit 12 (TEA 2261). The common connection of the transistors 10, 11 is connected to a first terminal of a first resistor 13 (39 Ohm), second terminal of which is connected to the cathode of a Zener diode 14 (2V7, 1.3 W). The first terminal of an inductance 15 (2.7 uH) is connected to the first terminal of the resistor 13 and the second terminal of the inductance is connected to the second terminal of the resistor 13. In addition, the second terminals of the parts 13, 15 are also connected to a first terminal of a capacitor 16 (470 uF). The second terminal of the capacitor 16 and the anode of the diode 14 are connected to the base of a transistor 17 (S2000AF) and also to the anode of a second diode 18 (BAT 85). The cathode of diode 18 is connected to a first terminal of a second resistor 19 (47 Ohm), second terminal of which is connected to the emitter of transistor 17 and to a third resistor 20 (0.15 Ohm; 2 W), which is also connected to ground. The collector of the transistor 17 is connected with a first terminal of primary winding of a transformator 21. Second terminal of primary winding is connected to a DC-voltage B+, which is directly rectified from mains.

The secondary winding of transformator 21 is connected to well known means, like a rectifier 22 and a capacitor 23, to supply non-shown stages.

A block 24 indicates further stages, which provide a direct current (DC) voltage during certain operation modes.

In the following text the function of the embodiment of FIG. 1, which is part of a switch mode power supply (SMPS) will be described.

The voltage across capacitor 16 determines the storage time of transistor 17. That means, the higher the voltage stored across capacitor 16, the smaller is the storage time. The voltage across capacitor 16 also provides a negative voltage to ensure that transistor 17 is provided with a breakdown voltage up to Vces, which is the collector/emitter breakdown voltage, under the condition that the base is directly connected to the emitter. This is useful during a switching off transition whwn the SMPS is operating. In this sense, operating means when the transistor is working as a switch which switches on and off to store energy on the primary winding of a non-shown SMPS transformer.

Before the control transistors 10, 11 start to generate first driving pulses, capacitor 16 will be charged by means 24. The current path for charging capacitor 16 is:

means 24—inductance 15—capacitor 16—diode 18—resistor 19—resistor 20 to ground.

Diode 18 is introduced in series with the resistor 19, which ensures the charge of capacitor 16 will be hold without discharge. Thereby it could be ensured during the first few driving pulses that the turn on time is minimised.

In the preferred embodiment, using as IC 12 the type TEA 2261, there are three phases for the start-up operation.

In phase 1, the control transistors 10, 11 are fully switched off that means, the transistor 11, often named as sink transistor, is at off-state. So the current provided by the meads 24 could charge the capacitor 16.

In phase 2, which is after phase 1, the transistor 11 is switched on. It may be mentioned that during this phase 2 also other means of the SMPS (not shown), like an oscillator, are switched on. The charge current for the capacitor 16 will be terminated. Due to the presence of the diode 18, a discharge of capacitor through the resistor 19 will be reduced or even nearly avoided. Without the diode 18 there would be a bigger amount of discharge of capacitor 16, so that the precharge, arranged by the means 24 would not be so effective.

In phase 3, the IC 12 starts a softstart driving. During this time the capacitor 18 could be charged by the current which also drives the base of transistor 17. But due to very small turn-on times, it would need a few hundred cycles of driving pulses to charge up the capacitor 16, if this capacitor 16 had no pre-charge by the means 24.

Without such a pre-charge at the beginning of the phase 3, the transistor 17 may be damaged by current up phenomena during the first few cycles. But as a discharge can be minimised or nearly even be avoided during the phases 1 and 2 by the presence of the diode 18, a sufficient charge of the capacitor can be realised which means that the storage time of transistor 17 is below a critical value.

It may be mentioned that in the preferred embodiment described above, a Schottky diode (BAT 85) is used. Such a diode has the advantage that it has a low forward voltage. Thereby it can be prevented that the transistor 17 is turned on during the charging phase 1.

Claims:

1. Protection Circuit for a switch mode power supply, characterised in that current-supply means (24) are provided which charge a capacitor (16) during a time before normal operation of said switch mode power supply;

means (18, 19) are provided between the base and the emitter of an output transistor (17) of said switch mode power supply, whereby discharge of said capacitor (16) is reduced.

2. Circuit according to claim 1, characterised in that said means are realised by a diode (18) and a resistor (19), which are connected in series.

3. Circuit according to claim 2, characterised in that said diode (18) is a Schottky-type diode.

* * * * *